United States Patent [19]
Weaver et al.

[11] Patent Number: 5,326,015
[45] Date of Patent: Jul. 5, 1994

[54] WIRE BONDER TAIL LENGTH MONITOR

[75] Inventors: James M. Weaver, Madison, Conn.; Ehud Efrat, Horsham; Daniel J. Muldoon, Hatboro, both of Pa.

[73] Assignee: Kulicke and Soffa Investments, Inc., Wilmington, Del.

[21] Appl. No.: 38,843

[22] Filed: Mar. 29, 1993

[51] Int. Cl.⁵ ......................................... H01L 21/603
[52] U.S. Cl. ..................................... 228/102; 228/4.5; 228/104; 228/180.5
[58] Field of Search ..................... 228/4.5, 9, 102, 103, 228/104, 180.5

[56] References Cited

U.S. PATENT DOCUMENTS

| | | | |
|---|---|---|---|
| 4,586,642 | 5/1986 | Dreibelbis et al. | 228/104 X |
| 4,925,083 | 5/1990 | Farassat et al. | 228/102 |
| 5,037,023 | 8/1991 | Akiyama et al. | 228/102 |
| 5,058,797 | 10/1991 | Terakado et al. | 228/104 |
| 5,238,173 | 8/1993 | Ura et al. | 228/104 |

*Primary Examiner*—Kenneth J. Ramsey
*Attorney, Agent, or Firm*—John B. Sowell

[57] ABSTRACT

Apparatus for monitoring the length of a fine wire tail made after the second bond of a fine wire interconnection includes a continuity circuit and a wire bond monitoring system (WBMS) in an automatic wire bonder. The Z axis position of the bonding tool is sensed to determined the height of the bonding tool on second bond and at the time the fine wire breaks from second bond. The monitoring circuit determines if the wire clamps are initiated and when and if the electronic flame-off control is fired. Logic circuit in the WBMS determine if wire tail after second bond is of a proper length to make a ball on the wire tail and if not, what remedial measures must be made to avoid damage to the semiconductor device being bonded.

19 Claims, 5 Drawing Sheets

WIRE BONDER TAIL LENGTH MONITOR

BACKGROUND OF THE INVENTION

1. Field of the Invention

The present invention relates to a system for monitoring the conditions of a fine wire bonded interconnection and more particularly to a monitoring system which detects the presence and length of a wire tail employed to make a ball in preparation for making proper wire bonded interconnections.

2. Description of the Prior Art

Automatic wire bonders that employ computer controls are known and described in U.S. Pat. Nos. 4,266,710 and 4,239,144 assigned to Kulicke and Soffa Industries, Inc., the same assignee as the present invention. Such high speed automatic wire bonders are capable of making eight complete wire interconnections per second. If the fine wire used to make these interconnections breaks improperly and/or is not properly fed through the bonding tool, a tail of proper length is not positioned below the working face of the bonding tool at the time a ball is made in preparation for the next interconnection. Both wedge bonders and ball bonders require a tail of proper length in order to continue to make proper bonds. Numerous problems occur which can cause a fine wire to be missing, too short or too long which will effect the ball size which is produced by an electronic flame off (EFO) device.

Very large scale integration (VLSI) devices are becoming more dense and are employing a greater number of lead out pads (electrodes) that must be wire bonded to lead connections on carriers or packages. As a result of the more dense devices, the lead out pads are becoming smaller and more fragile and the VLSI devices are becoming more expensive. When an automatic wire bonder attempts to bond a fine wire to a lead out pad and there is no fine wire, or no ball under the working face of the bonding tool, the bonding tool makes direct contact with the lead out pad and can easily destroy the pad and the very expensive VLSI device on the attempt to make the next wire bond interconnection.

Accordingly, it is becoming increasingly important to provide an apparatus and a method of monitoring the length and presence of a bonding tail that is made by an automatic wire bonder after the second bond of a fine wire interconnection to prevent the bonding tool from attempting to make a first or ball bond without a proper size ball under the working face of the bonding tool.

SUMMARY OF THE INVENTION

It is a principal object of the present invention to provide a novel wire bonder tail length monitor.

It is another principal object of the present invention to provide an apparatus and a method which accurately measures the length of a wire tail which is made after the second bond.

It is another principal object of the present invention to provide an apparatus for sensing a plurality of vertical axis positions of the bonding tool after making a second bond and for monitoring the wire continuity at each of the vertical axis positions so as to be able to calculate the wire length tail based on the position sensed.

It is another principal object of the present invention to monitor wire conditions and parameters which are necessary as a prerequisite to making an acceptable ball on a fine wire tail in preparation for making a fine wire interconnection.

It is another principal object of the present invention to monitor the time and current flowing to the fine wire during formation of the gold ball to verify and monitor the making of a proper size ball.

It is another principal object of the present invention to monitor fine wire parameters at the second bond and for initiating a restarting procedure for making a ball. When the parameters indicate that it is not possible to make a good ball on the fine wire tail that is present on the bonding tool, a restart procedure is employed.

It is another principal object of the present invention to monitor fine wire parameters after making a second bond and for stopping the wire bonder if there is not a sufficient tail to make a good ball or to restart.

It is yet another object of the present invention to provide a novel monitoring circuit and method of monitoring which is compatible with existing automatic wire bonders and enables the use of the present invention in existing or new wire bonding machines with only minor modifications.

According to these and other objects of the present invention, there is provided an automatic wire bonder having a position sensor and a central processing unit capable of sensing the exact height or Z position of the wire bonding tool above a semiconductor device at predetermined intervals of time. A continuity sensor and monitor is coupled to the fine wire. The Z axis position of the bonding tool is sensed at the lowest bond position, at the wire clamped position and at the Z position when the fine wire breaks. The differences between the lowest bond position and the Z position when the wire breaks is indicative of the length of the wire tail available to make a ball. Logic circuits are employed to determine when a tail is present within predetermined threshold limits that ensure that a good ball can be made and if not present, then measures are taken to avoid damage to the semiconductor device.

DESCRIPTION OF THE PREFERRED EMBODIMENT

Figure 1:
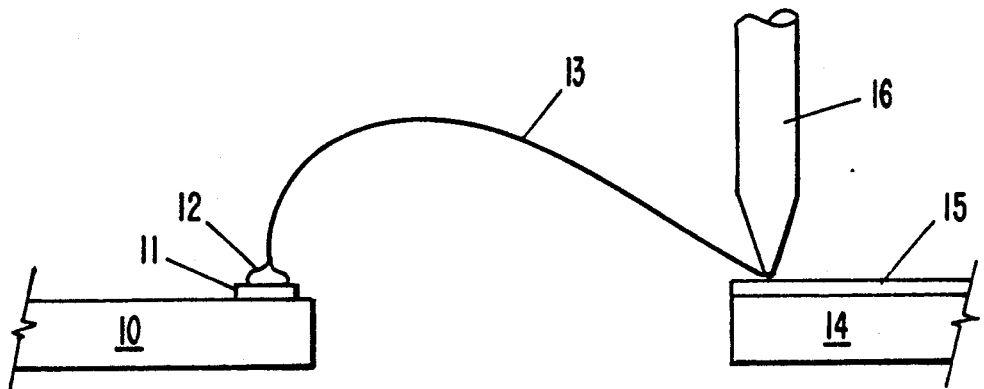
FIG. 1 is a schematic drawing of a capillary bonding tool at second bond position.
Figure 2:
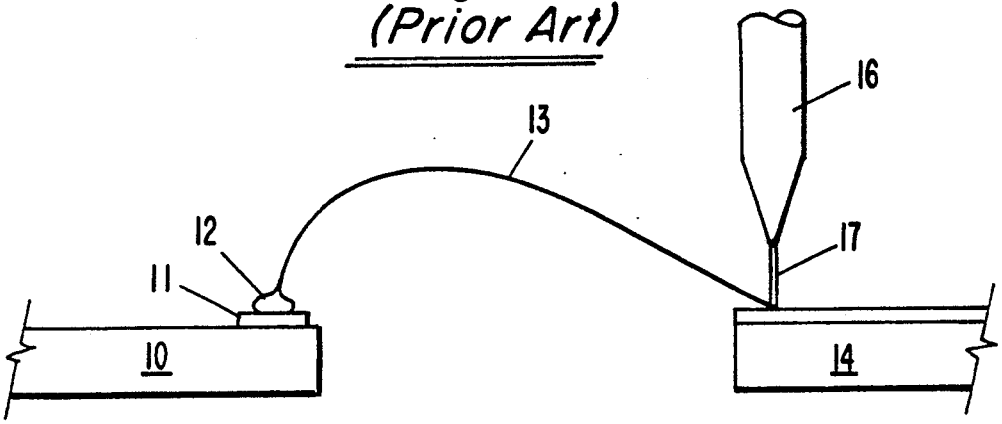
FIG. 2 is a schematic drawing of a capillary bonding tool raised above the second bond to a desired tail height position.
Figure 3:
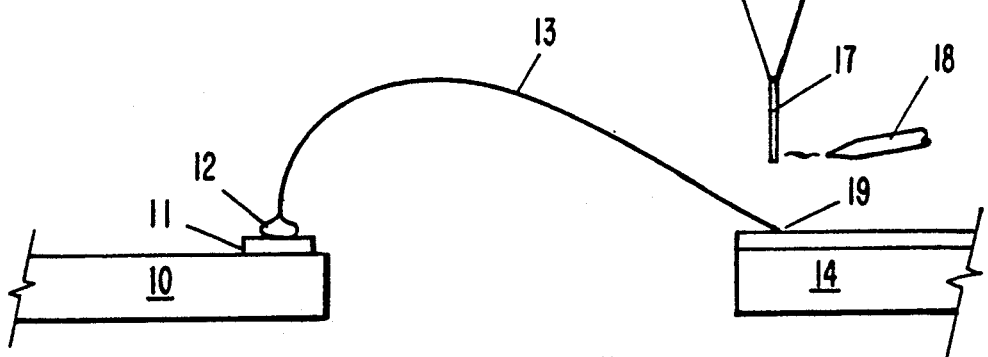
FIG. 3 is a schematic drawing of a capillary bonding tool raised above the second bond position to a desired flame-off position showing a proper length tail.

Refer now to FIGS. 1 through 3 showing a sequence of schematic drawings of a capillary bonding tool after making a fine wire interconnection and breaking the tail at second bond. The semiconductor device 10 is shown having an electrode or pad 11 onto which a ball bond 12 has been made. The capillary bonding tool has been raised above the first or ball bond 12 and moved to a position shown while paying out a length of fine wire 13 which forms the fine wire interconnection. The second bond is made on a lead or lead frame 14 onto which a coating or plating 15 is provided for electrical conductivity and protection as well as to enhance the bondability at second bond. The capillary bonding tool 16 is shown in its lower Z axis position in FIG. 1 where the wire 13 has been mashed and successfully bonded to the lead frame 14, 15 creating the second bond 19 thus interconnecting the device 10 to the lead 14. In FIG. 2 the wire clamps of the automatic wire bonder are in the open position and the capillary bonding tool 16 is raised to a tail height permitting the fine wire to feed through the capillary and form a tail 17 of proper tail length before closing the wire clamps (not shown). In FIG. 3 the wire clamps after being closed are raised simultaneously and together with the wire bonding tool 16 causing the tail 17 to break at second bond 19. While FIG. 3 is not drawn to proper scale, it is schematically representative of the relative position of the EFO electrode 18 at the time a ball is made on the tail 17. The proper tail height and flame-off heights for automatic wire bonders are discussed in detail in U.S. Pat. Nos. 4,266,710 and 5,111,986 assigned to Kulicke and Soffa Industries, Inc. the assignee of the present invention.

Figure 4:
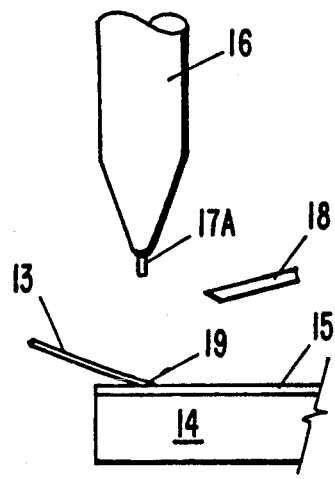
FIG. 4 is a schematic drawing of a capillary bonding tool which has no wire tail raised to flame-off position.

Refer now to FIG. 4 showing a schematic drawing of the capillary bonding tool 16 raised to a flame-off position having little or no tail 17A. A condition of this type can easily occur when the force of the bonding tool 16 is great enough in conjunction with the ultrasonic scrub to completely sever the fine wire 13 at second bond 19 and there is sufficient drag in the wire clamps to break the wire and cause the tail 17A to raise when the bonding tool is raised. In this condition, it is possible that the fine wire tail 17A is completely drawn into the recess of the capillary bonding tool 16 and would not be seen extending therefrom. Usually, when the EFO electrode 18 is fired, no arc will occur. It is entirely possible that an arc will occur especially if a sharp edge is present on the wire tail 17A. When the arc does occur, a proper ball is never made because the wire is so close to the capillary 16 that it forms a heat sink to prevent proper melting and forming of a ball. The worst that can occur is that some partial ball is made which clogs the capillary. The prior art automatic wire bonding machine would have sensed that a ball was made and would have attempted to proceed making wire bond interconnections. This could destroy the bond pads 11 on a semiconductor device 10 which may cost hundreds of dollars.

Figure 5:
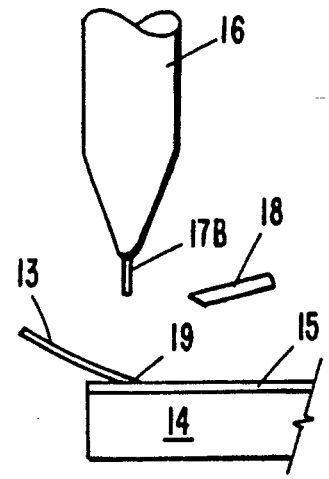
FIG. 5 is a schematic drawing of a capillary bonding tool raised to a flame-off position with only a short wire tail.

Refer now to FIG. 5 showing a schematic drawing of a capillary bonding tool raised to flame-off position and having a short tail 17B long enough to make some kind of ball when the EFO electrode 18 fires. Under this condition, the tail 17B is sufficiently long to produce a ball, however, the ball is too small to produce a proper first ball bond 12 of proper strength to permit a proper and reliable interconnection if a first ball bond can be made. When this condition is sensed, as will be explained in greater detail hereinafter, it is possible to direct the automatic wire bonder to proceed with a bond-off operation in which the improperly sized ball is bonded to a waste area on the device or the lead frame or even a bond-off station provided on the automatic wire bonder. After making a bond using the improper size ball, it is possible to produce a proper tail length 17 which is used to make a proper size ball 12 and proceed with the routine of wire bonding on the expensive semiconductor device 10. It has been found that a tail of the length shown in FIG. 5 is sufficient to make a ball which will permit a bond-off operation which in turn permits the making of a proper length tail and a proper size ball so that the automatic wire bonding machine can continue in its automatic mode without supervision.

In a manner similar to the bond-off operation just explained, a short tail 17A may permit a restart. A scratch pad which is at or near the bonding site is provided onto which a plurality of gold balls have been made and the wire broken just above the ball. When the condition shown in FIG. 4 occurs and it is impossible to make a proper ball, however, it is possible to bond the stub 17A to one of the balls on the scratch pad when the stub wires 17A extends from the capillary or is in the recess of the capillary. The stub 17A is bonded onto one of the previously provided gold balls on the scratch pad and when the ball sticks to the stub tail 17A, it is then possible to make a proper first bond, then make a short interconnection and a second bond which will permit making a proper length tail 17 so that a proper size ball 12 can be made and the automatic wire bonder can proceed making proper wire bond interconnections on the device 10.

Figure 6:
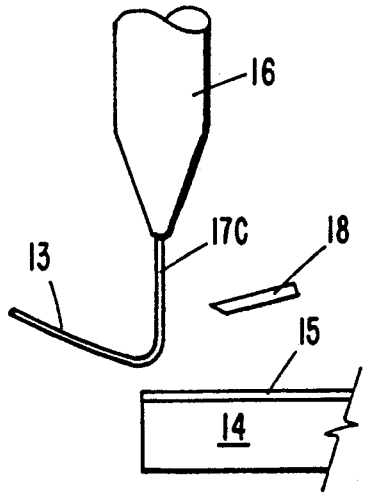
FIG. 6 is a schematic drawing of a capillary bonding tool raised to flame-off position with the second bond lifted from the lead finger and the wire tail still connected to the interconnecting wire.

Refer now to FIG. 6 showing a schematic drawing of a capillary bonding tool which is raised to flame-off position with the wire tail 17C still attached to the interconnecting wire 13. This condition is known as no-stick-on-lead, where the second bond pulls loose from the lead frame 14, 15. When this condition occurs, the automatic wire bonder must be stopped because there is a defective interconnection and any further bonding operation may result in destruction of the semiconductor device 10. There are several ways to proceed when a device is improperly bonded at second bond. The automatic wire bonder may be stopped to permit an attendant to break the wire and restart the machine and take the device from the production line so that it may be reworked. Some devices require such high standards that they cannot be properly reworked and when this condition occurs, it is possible to bond-off on the device, make a proper tail and ball and eject the improper bonded device from the automatic bonding machine and to continue bonding. An attendant is informed that the device was improperly bonded so it will not be carried through the production line. Further, it is possible to stop the bonding process and inform the operator and/or take corrective action in case one of the following defects is detected:

1. The tail is not long enough.
2. The tail is too long.
3. The tail did not separate from the interconnection on the lead finger.
4. The Electronic Flame-Off did not fire to the wire.

Figure 7:
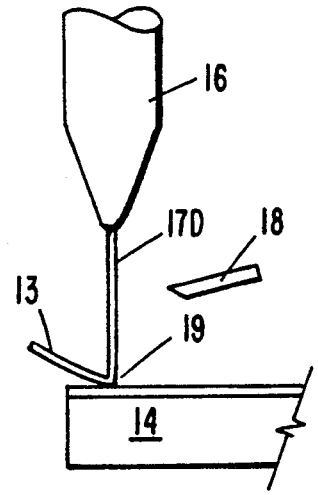
FIG. 7 is a schematic drawing of a capillary bonding tool raised to flame-off position with the wire tail still connected to the fine wire interconnection on the lead finger.

Refer now to FIG. 7 showing a schematic diagram of a capillary bonding tool raised to flame-off position where the wire tail 17D is still attached to the second bond 19. A condition of this type occurs when the wire clamps did not properly grip the wire above the capillary and when the capillary and wire clamps were closed and raised to the tail position shown at flame-off. The wire slipped and formed a tail 17D that did not break at second bond. While it is possible to conduct a procedure which would allow the automatic wire bonder to proceed with automatic wire bonding, the condition of the wire clamps which cause this long tail must be corrected, therefore the automatic wire bonder is preferably stopped immediately, leaving the long tail 17D for the attendant to observe as well as the noted condition on the monitor of the display of the automatic wire bonder. This will allow the attendant to make the adjustment to the wire clamps and do several bond-off operations to assure that the wire clamps are properly adjust and in proper working condition before proceeding with automatic wire bonding.

Figure 8:
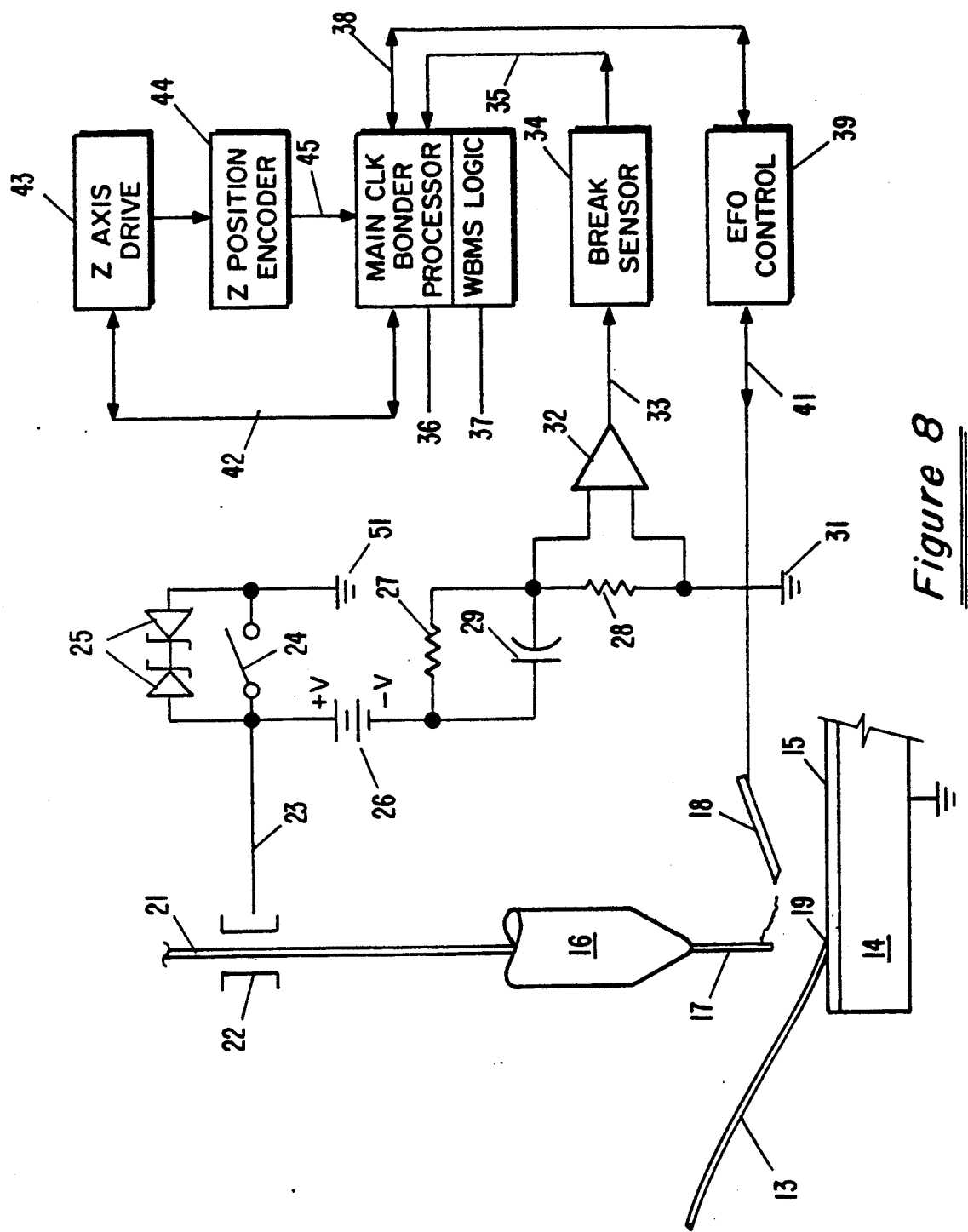
FIG. 8 is a schematic circuit diagram of a preferred conductivity logic circuit for monitoring and testing the length of a wire tail.

Refer now to FIG. 8 showing a schematic circuit diagram of a preferred embodiment conductivity logic circuit used for monitoring and testing the length of the wire tail. The second bond 19 is made on the conductive coating 15 of the lead 14 leaving the interconnecting wire 13. The capillary 16 is raised to the flame-off height after breaking the wire 21 and leaving a proper tail 17 juxtaposed the EFO electrode 18. The wire clamps 22 are shown in their closed position, however, it will be understood that the conductive wire 21 is engaged against the conductive electrodes so as to present a continuous electrical path to the line 23 through the wire 21 even when open. Line 23 is shown connected to a analog switch 24 which is normally open during continuity testing. The current and voltage for continuity testing through the wire 21 is provided by a D.C. source 26 which is connected at its negative side to a voltage divider represented by two resistors 27 and 28 connected to a return ground path 31. The resistor 27 is shunted by a capacitor 29 used to decrease the response time of the sensing circuit. The voltage across resistor 28 is applied to an isolation amplifier 32 which feeds a comparator for sensing continuity or no continuity. The output sensed on line 33 is applied to a break sensing circuit 34 which applies a logic signal via line 35 to the Z axis processor 36. The Z axis processor 36 is provided with software and/or hardware shown as a wire bonder monitoring system logic (WBMS) 37. After the main bonder processor 36 has sensed that the wire 21 has broken at second bond 19 and provided a proper tail 17, a signal is provided on line 38 to the EFO control 39 which applies a proper EFO voltage to the electrode 18 so as to generate a arc which melts the end of the tail 17 and forms a ball of the type used for the first ball bond 12. The preferred embodiment automatic wire bonders which include the Z axis processor 36 is shown having a lead connection 42 to a Z axis drive 43. The Z axis drive 43 is directly coupled to a Z position encoder 44 and the encoder 44 supplies digital information via line 45 to the Z axis processor 36 which enables the Z axis processor 36 to know the exact position of the bonding capillary 16 at all times during the logical operation of the automatic wire bonder.

Figure 9:
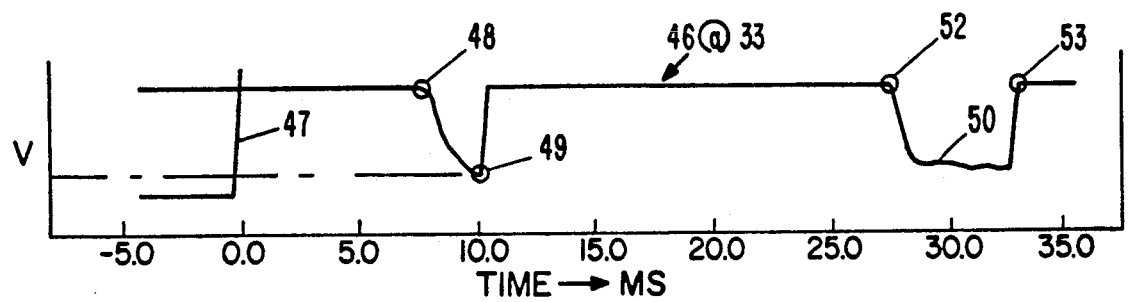
FIG. 9 is a wave form of voltage versus time produced by the logic circuit of FIG. 8 when a good tail is produced.

Refer now to FIG. 9 showing a voltage wave form 46 taken at line 33. Superimposed on FIG. 9 is a wave form 47 representing the time the wire clamps 22 are instructed to close by the bonder processor 36. Within 3 milliseconds of the time wave form 47 goes high, the wire clamps are normally closed. After the wire 21 is clamped by the clamps 22 and the capillary 16 proceeds to be raised in the vertical axis direction, the wire 21 breaks at point 48. The voltage drops to ground reference voltage shown at point 49. When the break is sensed at point 48, the main processor 36 generates a signal on a line not shown which closes the analog switch 24 which is shown closed at point 49 on wave form 46. When the analog switch 24 closes, the positive voltage is applied to the return ground path 51 which is connected to the return ground 31. The voltage applied to the return ground path 31 is superimposed across resistor 28 which is sensed at the comparator amplifier 32. The voltage produces a high level output on line 33 which remains high until point 52 when the EFO control 39 fires. The voltage at electrode 18 causes the voltage on line 33 to drop to the low level 50 for the duration of the arc produced by the electrode 18. The voltage rises again to its high level reference at point 53 when the arc ceases. It will be appreciated that the voltage change shown at points 52 and 53 are sensed through the wire monitoring system and the wire 21, thus it is possible to conclude and confirm that the arc from the electrode 18 has reached the wire 21 and not arced off to some remote place other than the wire 21.

It can be concluded from the information and the timing shown in FIG. 9 and supplied to the processor 36 using the logic 37 that the wire clamps 22 closed and caused the wire 21 to break at second bond 19 at the proper tail height as verified by points 48 and 49 on wave form 46. Further, it is possible to conclude and confirm that the arc from the electrode 18 has fired and has reached the tail 17 and thus has produced a ball because of the proper duration of the arc which occurs between points 52 and 53 without having to physically examine the end of the tail on which the ball was made. Thus, FIG. 9 corresponds to the proper tail condition shown in FIGS. 3 and 8.

Figure 10:
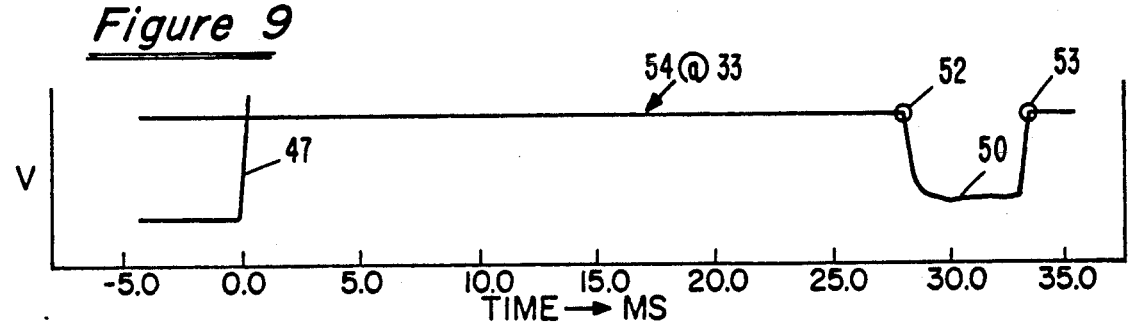
FIG. 10 is a wave form of voltage versus time produced by the logic circuit of FIG. 8 when the wire tail does not break at the proper range of vertical axis positions.

Refer now to FIG. 10 showing a wave form 54 which is produced at line 33 of FIG. 8. The signal indicating that the wire clamps 22 were instructed to close is shown as wave form 47. Wave form 54 has no wave form 48, 49 as shown in FIG. 9, thus indicating that the wire 22 was not broken at the second bond 19 to produce a tail 17. It will be noted that since wave form 54 is still in the high condition and the bonding tool 16 has been raised to flame-off height, there is still continuity at the time the wire should have broken. However, since the EFO did properly fire as shown by points 52 and 53 on wave form 54 we can properly conclude that the wire did break after the analog switch 24 was closed otherwise the discontinuity shown by points 48 and 49 on wave form 46 would be present on wave form 54. This condition represents a fault which must be attended by the operator and is known as a no-stick on the lead (second bond) condition.

Figure 11:
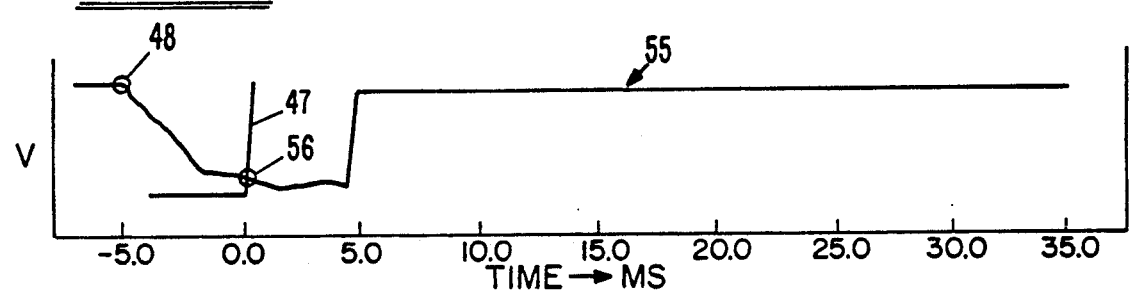
FIG. 11 is a wave form of voltage versus time produced by the logic circuit of FIG. 8 when the wire tail is not of sufficient length.

Refer now to FIG. 11 showing a wave form 55 where no ball is produced. The aforementioned signal 47 indicates the point in time at which the wire clamps 22 is instructed to close. At that time the wave form 56 is already at a low voltage condition as shown by point 56 indicating that the wire has already broken at point 48 before the wire clamps were instructed to close. The processor 36 has already sensed the Z position of the bonding tool 16 at point 48 of wave form 55, thus, the tail length can be properly calculated if the wire tail is not sucked into the capillary by the tensioning device. In such condition, once the break is sensed, the wire clamps 22 are immediately ordered to close to keep the wire tail from being sucked into the capillary 16. In the preferred embodiment of the present invention, not only is the wire clamp mechanism immediately actuated but the tensioning device is disabled and if the computer 36 senses that a tail of sufficient length is made which would permit a bond-off operation to be performed, then a routine may be entered to perform a second bond. The wave form 55 shows voltage drop at the time the EFO was supposed to fire at points 52, 53, thus, there is no ball. If a short tail is present, it may be bonded to an off site ball.

Figure 12:
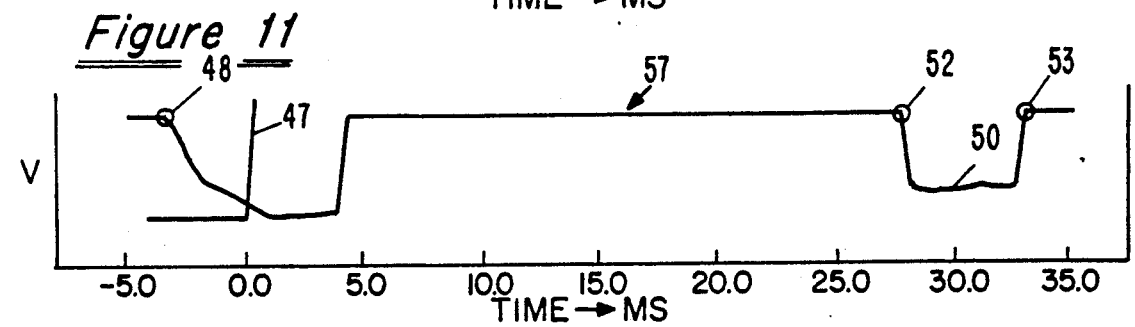
FIG. 12 is a wave form of voltage versus time produced by the logic circuit of FIG. 8 when the wire tail was too short and the EFO attempted to make a ball.

Refer now to FIG. 12 showing a wave form 57 where a short tail and a ball was produced. Wave form 57 is similar to wave form 55 in that the break at point 48 occurred before the wire clamps could be closed but produced a short tail. Normally the processor would stop the cycle and not attempt to fire the EFO. However, a ball of improper size for a proper interconnection could be made from a short tail. After firing the EFO as shown as points 52 and 53, it is now possible to go to a bond-off site and bond the improper size ball and make an interconnection and then make a proper tail which will produce a proper ball size for a proper interconnection and to proceed with automatic wire bonding without having to call for the attendance of an operator. FIG. 12 is typical of a condition that occurs when the tail is weakly attached at the second bond and does not have sufficient strength to resist breaking by the tension on the wire while the capillary is being moved, thus, is indicative of a process condition as distinguished from a machine set up or adjustment condition.

Figure 13:
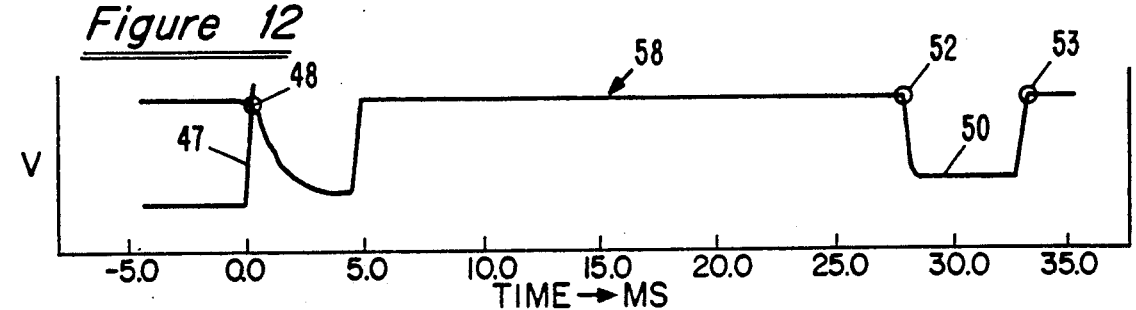
FIG. 13 is a wave form of voltage versus time produced by the logic circuit of FIG. 8 when a short tail is produced by improper gap of the wire clamps.

Refer now to FIG. 13 showing a wave form 58 having a wire break at point 48 before the wire clamps 22 are completely closed and shortly after the wire clamp signal 47 attempts to close the wire clamps. A condition of this type can occur when the wire clamps are marginally open, but are too tight and require readjustment. Even though a ball may be made on the short tail as indicated by the points 52 and 53, this condition requires an operator to make proper readjustment of the wire clamps, thus, the automatic wire bonder is stopped and the condition is signaled on the monitor panel of the automatic wire bonder.

Figure 14:
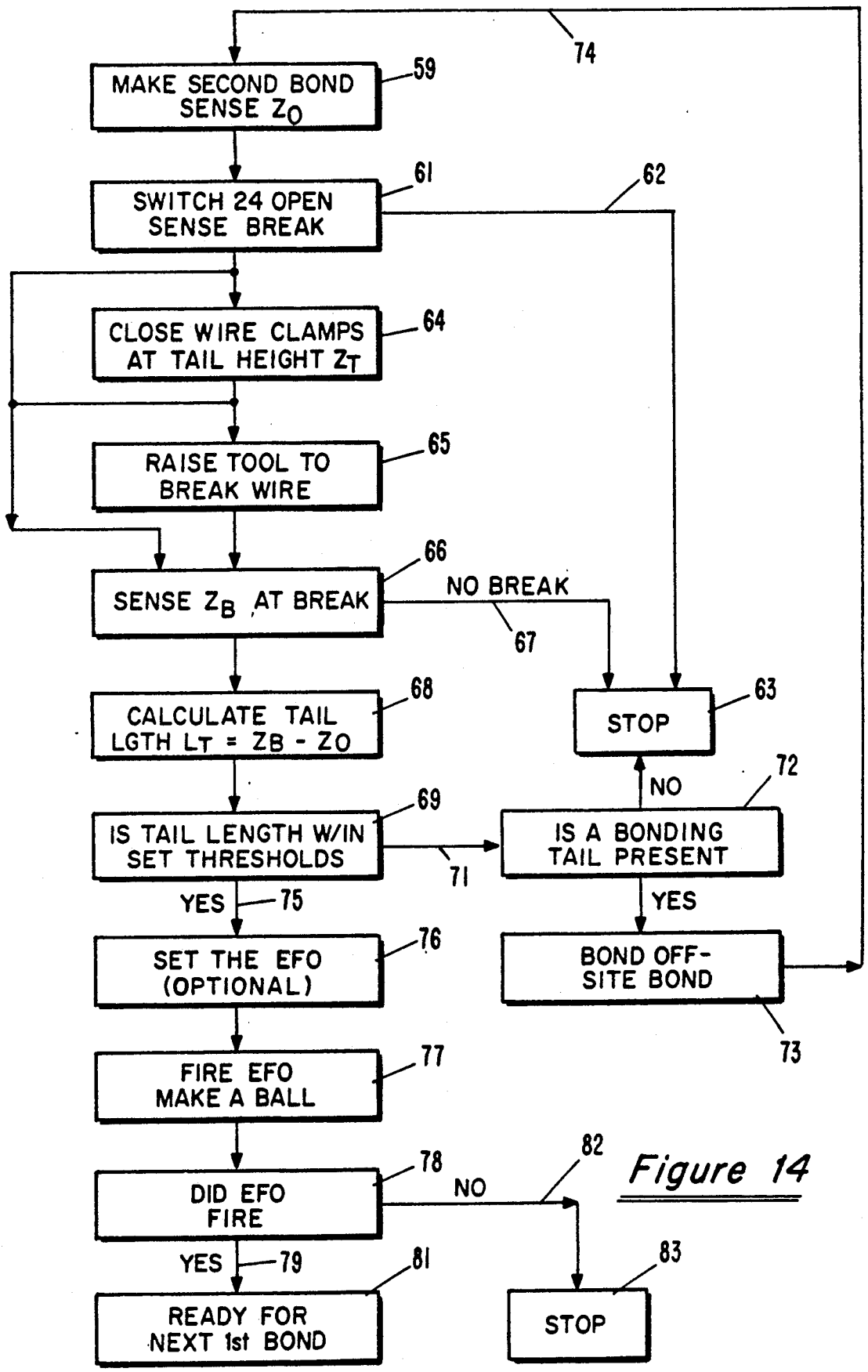
FIG. 14 is a logic block diagram of the preferred embodiment steps performed after making a second bond.

Refer now to FIG. 14 showing a logic block diagram of the preferred embodiment steps performed after making a second wire bond to monitor the different types of tail conditions discussed hereinbefore with reference to FIGS. 4 through 13. Block 59 represents the start of the wire bond monitoring operation after the second bond is made. At block 59 the zero vertical height $Z_O$ of the bonding tool is recorded at second bond. The WBMS logic senses whether the analog switch 24 is open in block 61 and senses if a break has been made. If a break has been made before the wire clamps are closed, this signal is sensed on line 62 and the logic is instructed to stop the wire bonding operation in block 63 because some malfunction has occurred. When the switch 24 is open, the sensor is sensing for a break. The wire clamps are closed at tail height in block 64. After closing the wire clamps 22, the capillary tool 16 is raised in order to break the wire 21 in block 65 while continuing to sense for a break in block 66 where the break is ordinarily sensed. If no break occurs after the bonding tool is raised sufficiently to break the wire, this is sensed on line 67 and the wire bonder logic 37 is instructed to stop the operation in block 63. If the break occurs in the predetermined height region, the Z height of the bonding tool 16 is sensed and this enables the microprocessor and computer logic 36, 37 to calculate the tail length in block 68 which is equal to the $Z_B$ breaking point minus the $Z_O$ role original second bond height. After calculating the tail length $L_T$, it is now possible to determine if the tail length is within the preset thresholds in block 69 which insure that a proper bond will be made on the tail. If the tail is too long or too short, this condition is sensed on line 71. It is determined whether a bonding tail is present in block 72 which permits the logic 37 to perform a bond-off site bond in block 73. When a new tail of sufficient length is made at bond-off, it may be tested for a successful operation by repeating the process via line 74. If the tail length is within the preset thresholds as sensed on line 75, the EFO parameters may be set in block 76 to make a proper ball. The operation is then continued by firing the EFO to make the ball in block 77. It is then possible to sense if the EFO fired in block 78 as explained hereinbefore. If the EFO does fire and the tail length was proper and all other conditions are in place this is sensed on line 79 and it is assumed in block 81 that the ball is present and the automatic wire bonder is ready for the next first wire bond to make another interconnection. However, if the EFO does not fire as sensed on line 82, proceed to a stop operation in block 83.

Having explained a preferred embodiment of the present invention using a wire bonding logic system (WBMS) and circuits which may be incorporated into existing wire bonders in the field as well as incorporated into new wire bonders, it will be appreciated that the present invention satisfies a problem which has long existed and caused expensive destruction of semiconductor devices.

What is claimed is:

1. Apparatus for monitoring the length of a fine wire tail made after a second bond, comprising:
   means for sensing the initial $Z_O$ vertical axis height of a bonding tool at second bond,
   means for sensing the height $Z_B$ of said bonding tool while moving upward when said fine wire is electrically disconnected from said second bond,
   logic control means for determining if a proper length fine wire tail has been made, and
   EFO monitor means for monitoring and controlling an electronic flame off electrode coupled to said logic control means for making a ball on a wire determined to be a proper length fine wire tail.

2. Apparatus for monitoring as set forth in claim 1 wherein said logic control means comprises means for determining the length $L_T$ of said fine wire tail.

3. Apparatus as set forth in claim 2 wherein said logic control means comprises bonder processor means having input means for setting predetermined tail length threshold values.

4. Apparatus as set forth in claim 3 wherein said logic control means comprises means for comparing said tail length threshold values with the actual tail length $L_T$.

5. Apparatus as set forth in claim 4 wherein said logic control means comprises means for setting control values in said EFO monitor means and for initiating the making of a ball on fine wire tail.

6. Apparatus as set forth in claim 1 wherein said means for determining if a proper length fine wire tail has been made comprises a continuity sensor circuit coupled between said fine wire and a return path.

7. Apparatus as set forth in claim 6 wherein said continuity sensor circuit comprises a direct current source coupled to a contact maintained in engagement with said fine wire.

8. Apparatus as set forth in claim 7 wherein said continuity sensor circuit comprises normally open switch means for actuating said continuity circuit.

9. Apparatus as set forth in claim 8 wherein said continuity sensor circuit comprises means for sensing a break in said fine wire and for closing said switch means before initiating said EFO monitor means for making a ball.

10. Apparatus as set forth in claim 7 which further includes means for recording statistical fine wire tail length data.

11. Apparatus as set forth in claim 1 wherein said logic control means include means for determining when a second bond does not stick to a bonded device.

12. Apparatus as set forth in claim 1 wherein said logic control means includes means for diagnosing the cause of an improper length wire tail.

13. Apparatus as set forth in claim 12 wherein said logic control means comprises means for correcting an improper length tail by making an off-site bond and a proper size ball.

14. Apparatus as set forth in claim 12 wherein said logic control means comprises means for ceasing automatic bonding operation and possible damage to a semiconductor device.

15. A method of monitoring the making of fine wire tails after making a second wire bond of a fine wire interconnection, comprising the steps of:
    making a second wire bond with a fine wire in a bonding tool,
    raising the bonding tool to a predetermined tail length height while the fine wire is still attached to said second bond,
    clamping the fine wire at said tail length height,
    raising said bonding tool to a flame off height after clamping said fine wire to break said fine wire at said second bond,
    sensing the Z axis height of said bonding tool at said second bond and at the Z axis height when said fine wire breaks,
    determining the length of fine wire tail extending from said bonding tool, and
    determining if the length of fine wire tail is of a length that is proper for making a ball on said fine wire tail before making a ball.

16. The method as set forth in claim 15 which further includes the step of comparing the tail length $L_T$ with a desired tail length to determine if a proper ball can be made.

17. The method as set forth in claim 16 which further includes the step of generating an electronic flame-off voltage near the end of said wire tail to form a ball at the end of the fine wire tail length.

18. The method as set forth in claim 17 which further includes the steps of determining that the tail length $L_T$ is too short to make a proper ball,
    performing a sequence of bond-off steps resulting in making a second wire tail of length $L_T$, and
    comparing the new tail length $L_T$ with said desired tail length to determine if a proper ball can be made.

19. The method as set forth in claim 15 wherein the step of determining if a proper ball can be made on the fine wire further includes the step of determining that further bonding operations must stop before damaging a semiconductor device.

* * * * *